(12) United States Patent
Chou et al.

(10) Patent No.: US 6,249,187 B1
(45) Date of Patent: Jun. 19, 2001

(54) MONOLITHIC CRT VIDEO POWER AMPLIFIER SYSTEM

(75) Inventors: Chung-Ming Chou, Chung-Ho; Danny Tsong, Taipei; William Y. W. Tang, Taipei, all of (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/314,562

(22) Filed: May 19, 1999

Related U.S. Application Data

(63) Continuation of application No. 09/215,905, filed on Dec. 18, 1998, now abandoned.
(60) Provisional application No. 60/068,579, filed on Dec. 23, 1997.

(51) Int. Cl.[7] ....................................................... H03F 3/26
(52) U.S. Cl. ........................................... 330/288; 330/267
(58) Field of Search ..................................... 330/255, 263, 330/265, 267, 288; 348/707

(56) References Cited

U.S. PATENT DOCUMENTS 5,399,991  3/1995  Moraveji ............................... 330/255
5,789,980  8/1998  Nagata et al. .................... 330/255 X

*Primary Examiner*—Steven J. Mottola
(74) *Attorney, Agent, or Firm*—Pedro P. Hernandez; W. James Brady, III; Frederick J. Telecky, Jr.

(57) ABSTRACT

A monolithic power amplifier system is described which comprises a biasing system 50, transconductance amplifier circuit 42 and a transimpedance amplifier circuit 44 biasing network 50 is operable to generate a bias voltage which is used by the transimpedance amplifier 44. The transimpedance amplifier 44 receives an input current signal from the transconductance amplifier 42. The changes in the input current are communicated to a pull-up transistor 184 and a pull-down transistor 190 which drive an output voltage $V_{OUT}$ at sufficient levels to power the cathode of an electron gun of a video system.

9 Claims, 2 Drawing Sheets

MONOLITHIC CRT VIDEO POWER AMPLIFIER SYSTEM

This application is a continuation of Ser. No. 09/215,905, filed Dec. 18, 1998, abandoned, and claims benefit to U.S. provisional application Ser. No. 60/068,579, filed Dec. 23, 1997.

TECHNICAL FIELD OF THE INVENTION

This invention relates in general to the field of electronic systems, and more particularly to an improved monolithic CRT video power amplifier system.

BACKGROUND OF THE INVENTION

Conventional circuits used to power the cathodes of the electron guns for video displays such as CRTs or monitors are typically formed from discrete transistors and components due to the large voltages and power dissipations inherent in the operation of these systems. Component mismatches make these systems difficult to replicate on a cost-effective basis. In addition, discrete systems increase the component count of the overall system and thereby increase both the manufacturing cost and the size of the system.

Some hybrid systems have been developed where certain portions of the video amplifier system are placed on integrated devices. However, circuit designs have been unable to integrate the complete system due to the design of the amplifiers used in the systems. This is due to the fact that the large voltages necessary to operate the cathode of the electron guns create situations where portions of the amplifier are required to dissipate large amounts of power. In some implementations, these points in the circuit comprise large resistors, which due to the required heat dissipation of the components are incapable of being integrated with the remainder of the power of the video amplifier system.

Accordingly, a need has arisen for a video amplifier system that integrates a larger number of the components required to drive the cathodes of the electron guns in video system.

SUMMARY OF THE INVENTION

In accordance with the teachings of the present invention, a monolithic video power amplifier system is provided that substantially eliminates or reduces disadvantages associated with prior systems.

According to one embodiment of the present invention, a system is provided that comprises a biasing network, a transconductance amplifier and a transimpedance amplifier constructed in a single semiconductor layer. The transimpedance amplifier utilizes pull-up and pull-down transistors and a multistage current mirror amplifier architecture to enable the output of a voltage sufficient to drive the cathode of an electron gun from a fully integrated device.

BRIEF DESCRIPTION OF THE DRAWINGS

A more complete understanding of the present invention may be acquired by referring to the accompanying figures in which like reference numbers indicate like features and wherein.

DESCRIPTION OF THE INVENTION

Figure 1:
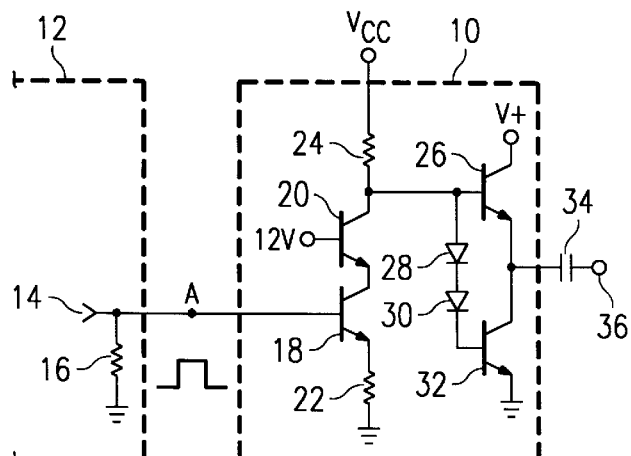
FIG. 1 is a schematic illustration of conventional architectures for a transimpedance amplifier.

FIG. 1 is a schematic illustration of a prior art architecture for a power amplifier that could be used in driving a cathode of an electron gun of a video system. The system in FIG. 1 shows the output portion of a first stage amplifier system 12, which receives a signal 14 that is biased at some level above ground potential by a resistor 16. The signal is passed through a node A to the base of a transistor 18 which is logically defined within a second stage amplifier system 10. The emitter of transistor 18 is coupled to ground potential through a resistor 22. The collector of transistor 18 is coupled to the emitter of a bipolar transistor 20. The base of bipolar transistor 20 is coupled to a supply voltage which may be on the order of 12 volts. The collector of transistor 20 is coupled to a supply voltage $V_{cc}$ through a resistor 24. Supply voltage $V_{cc}$ is typically on the order of 80 volts. The collector of transistor 20 is also coupled to the base of a transistor 26. The collector of transistor 26 is coupled to a constant supply voltage. The emitter of transistor 26 is coupled to an output node 36 through a capacitor 34. The emitter of transistor 26 is also coupled to the collector of a transistor 32. The emitter of transistor 32 is coupled to ground potential. The base of transistor 26 is coupled to the base of transistor 32 through the series connection of two diodes 28 and 30.

In operation, system 10 outputs a very high voltage output signal at node 36. The operation of system 10 results in a large amount of current being passed through resistor 24, diodes 28 and 30 and transistor 32. Because of the large amount of current through resistor 24, it has hereto been impossible to integrate the components of system 10 on a single semiconductor layer. Resistor 24 dissipates too much heat and causes too much interference with the operation of other components to integrate resistor 24 with other components in a single semiconductor package. The inability to integrate an amplifier system in a single semiconductor package has resulted in a higher component count which results in higher costs of the overall system.

Figure 2:
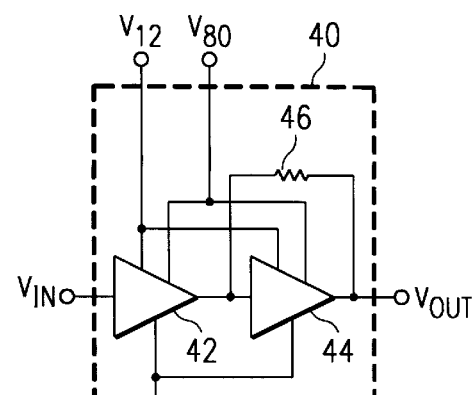
FIG. 2 is a schematic illustration of the power amplifier system of the present invention.

FIG. 2 is a schematic illustration of a monolithic power amplifier system 40 constructed according to the teachings of the present invention. System 40 comprises a transconductance amplifier system 42 which is operable to receive an input voltage signal $V_{IN}$. Transconductance amplifier system 42 is also coupled to ground potential, a 12 volt supply voltage and an 80 volt supply voltage. The output of amplifier 42 is input to a transimpedance amplifier system 44. Amplifier 44 is also coupled to ground potential and to the 12 and 80 volt supply voltages. The output of amplifier 44 is the output voltage $V_{OUT}$ of system 40. The output voltage signal is typically passed through a capacitor, some sort of DC restoration circuitry and then directly to the cathode of an electron gun in a video system. System 40 also comprises a feedback resistor 46 which is coupled between the input and output of amplifier 44. As will be discussed fully herein, because of the unique design of the components within system 40, system 40 is capable of being constructed on a single semiconductor substrate.

Figure 3:
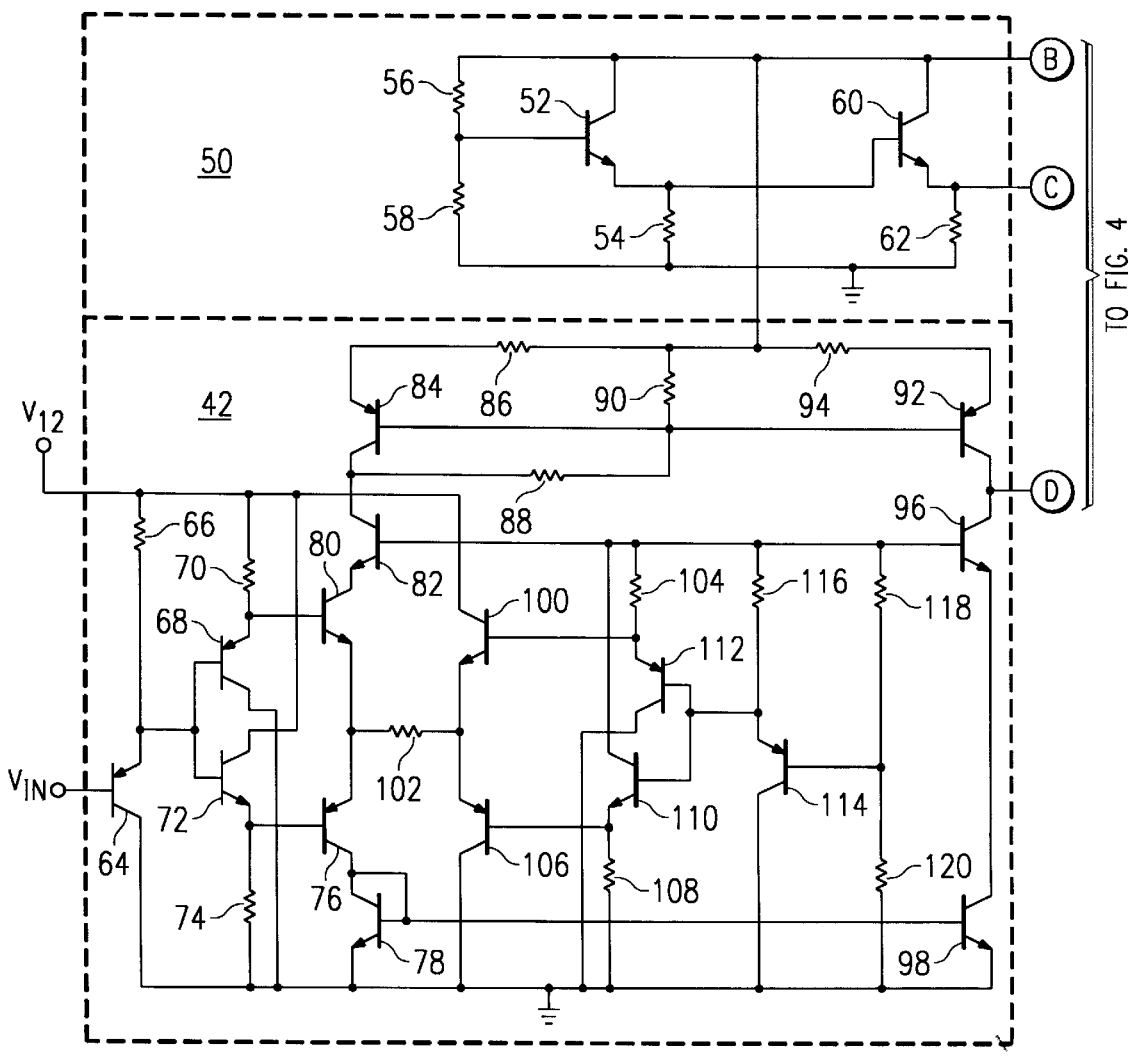
FIG. 3 is a schematic illustration of one embodiment of a bias network and transconductance amplifier stage of the power amplifier system of the present invention.
Figure 4:
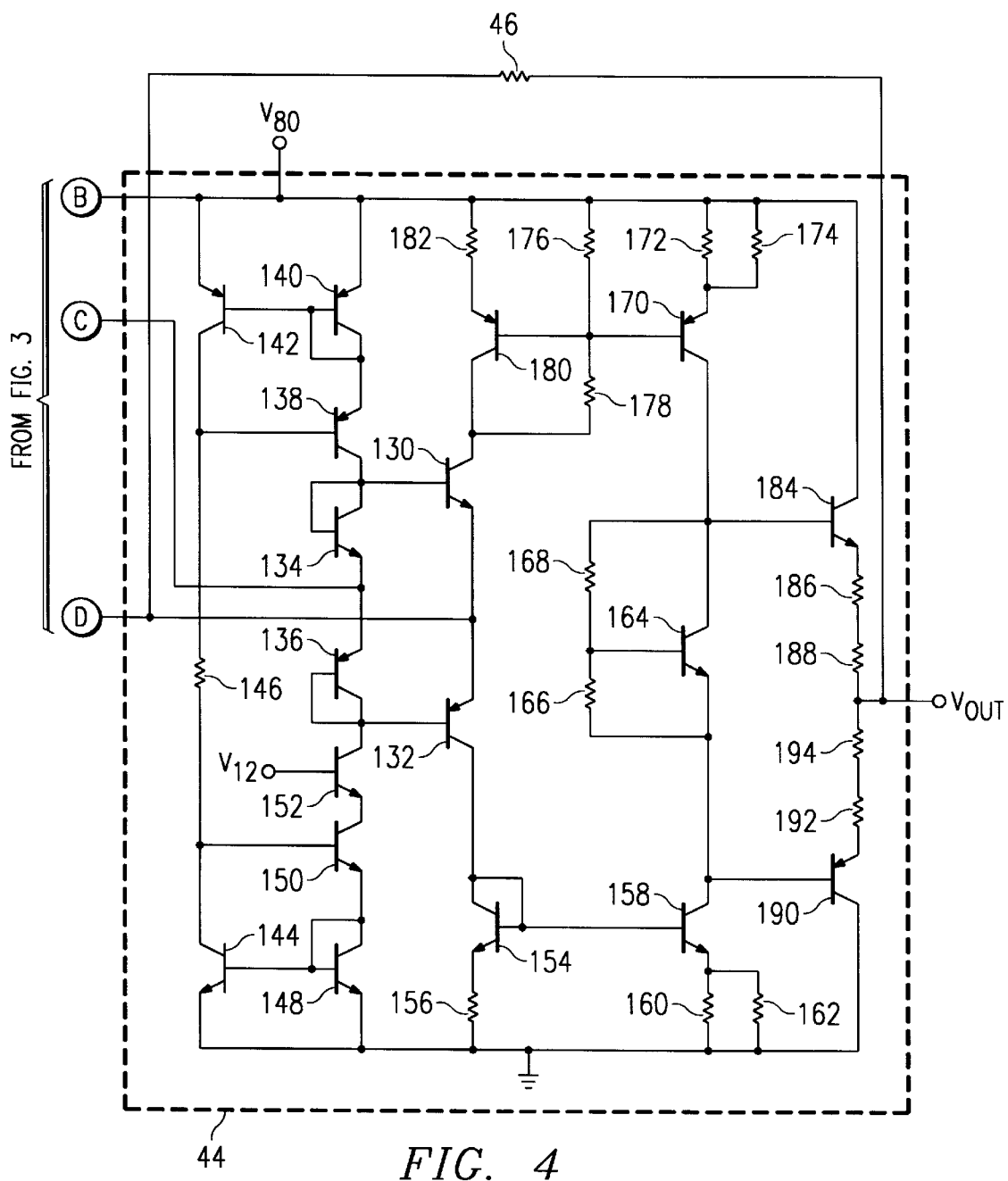
FIG. 4 is a schematic illustration of one embodiment of a transimpedance amplifier stage that may be used in the power amplifier system of the present invention.

FIGS. 3 and 4 together illustrate a schematic diagram of one embodiment of the monolithic amplifier constructed according to the teachings of the present invention. Referring to FIG. 3, a biasing network 50 is formed on the same semiconductor substrate as the transimpedance amplifier 44 and the transconductor amplifier 42. Biasing network 50 comprises an NPN transistor 52 which has its collector coupled to the 80 volt supply voltage and its emitter coupled to ground potential through a resistor 54. Transistor 52 may be on the order of 10 times the minimum transistor size. Resistor 54 may be on the order of 100 KΩ. The base of transistor 52 is coupled to the 80 volt supply voltage through a resistor 56 and is coupled to ground potential through a resistor 58. Resistor 56 is on the order of 40 K and resistor 58 is on the order of 250 KΩ. The emitter of transistor 52 is coupled to the base of an NPN transistor 60. Transistor 60 may also be on the order of 10 times the minimum transistor size. The collector of transistor 60 is coupled to the 80 volt supply voltage. The emitter of transistor 60 is coupled to ground potential through a resistor 62 which may be on the order of 40 KΩ.

FIG. 3 also includes an exemplary schematic for one embodiment of transconductor amplifier system 42. Amplifier 42 receives the input voltage signal $V_{in}$ at the base of a transistor 64. Transistor 64 may comprise a PNP transistor equivalent to the minimum transistor size. The emitter transistor 64 is coupled to the 12 volt supply voltage through a resistor 66. Resistor 66 is on the order of 10 KΩ in resistance. The collector of resistor 64 is coupled to ground potential. The emitter of transistor 64 is also coupled to the base of a PNP transistor 68. Transistor 68 is on the order of 5 times the minimum resistor size. The emitter of transistor 68 is coupled to the 12 volt supply voltage through a resistor 70. Resistor 70 is on the order of 5 KΩ in resistance. The collector of transistor 68 is coupled to ground potential.

The emitter of transistor 64 and the base of transistor 68 are also coupled to the base of an NPN transistor 72. Transistor 72 is on the order of 10 times the minimum transistor size. The collector of transistor 72 is coupled to the 12 volt supply voltage. The emitter of transistor 72 is coupled to ground potential through a resistor 74 which may be on the order of 5 KΩ in resistance. The emitter of transistor 72 is coupled to the base of a PNP transistor 76. Transistor 76 is on the order of 40 times the minimum transistor size. The collector of transistor 76 is coupled to the collector of an NPN transistor 78 which is also on the order of 40 times the minimum transistor size. The emitter of transistor 78 is coupled to ground potential. The collector of transistor 78 is coupled to the base of transistor 78. The emitter of transistor 76 is coupled to the emitter of an NPN transistor 80 which is on the order of 40 times the minimum transistor size. The base of transistor 80 is coupled to the emitter of transistor 68. The collector of transistor 80 is coupled to the emitter of an NPN transistor 82 which is on the order of 40 times the minimum transistor size. The collector of transistor 82 is coupled to the collector of a PNP transistor 84 which is on the order of 40 times the minimum transistor size. The emitter of transistor 84 is coupled to the 80 volt supply voltage through a resistor 86 which is on the order of 200 Ω in resistance. The collector of transistor 84 is coupled to the base of transistor 84 through a resistor 88 which is on the order of 1 KΩ of resistance. The base of transistor is coupled to the 80 volt supply voltage through a resistor 90 which is on the order of 50 KΩ in resistance. The base of resistor 82 is also coupled to the 12 volt supply voltage.

The base of transistor 84 is coupled to the base of a PNP transistor 92 which on the order of 80 times the minimum resistor dimension. The emitter of transistor 92 is coupled to the 80 volt supply voltage through a resistor 94 which is on the order of 200 KΩ in resistance. The system 42 outputs a variable current signal to the transimpedance amplifier 44 from the emitter of transistor 92. Emitter of transistor 92 is also coupled to the emitter of an NPN transistor 96 which is on the order of 80 times the minimum transistor size. The base of transistor 96 is coupled to the 12 volt voltage supply. The emitter of transistor 96 is coupled to the collector of an NPN transistor 98 which is on the order of 80 times the minimum transistor size. The base of transistor 98 is coupled to the base of transistor 78. The emitter of transistor 98 is coupled to ground potential.

The emitter of transistor 76 is coupled to the emitter of an NPN transistor 100 through a resistor 102. Resistor 102 is on the order of 240 Ω in resistance. Transistor 100 is on the order of 40 times the minimum transistor size. The collector of transistor 100 is connected to the 12 volt voltage supply. The base of transistor 100 is connected to the 12 volt power supply through a resistor 104 which is on the order of 25 KΩ in resistance. The emitter of transistor 100 is connected to the emitter of a PNP transistor 106 which is on the order of 40 times the minimum transistor size. The collector of 106 is connected to ground potential. The base of transistor 106 is connected to ground potential through a resistor 108 which is on the order of 1 KΩ in resistance. The base of transistor 106 is also connected to an NPN transistor 110 which is on the order of 5 times the minimum transistor size. The collector of transistor 110 is connected to the 12 voltage supply. The base of transistor 110 is connected to the base of a PNP transistor 112 which is on the order of 10 times the minimum transistor size. The emitter of transistor 112 is connected to the base of transistor 100. The collector of 112 is connected to ground potential. The bases of transistors 110 and 112 are connected to the emitter of a PNP transistor 114 which is on the order of the minimum transistor size. The emitter of transistor 114 is also connected to the 12 volt power supply through a resistor 116 which is on the order of 50 KΩ in resistance. The collector of transistor 114 is connected to ground potential. The base of transistor 114 is connected to the 12 volt power supply through a resister 118 which is on the order of 210 KΩ in resistance. The base of transistor 114 is connected to the ground potential through a resistor 120 which is on the order of 30 KΩ in resistance.

Transconductor amplification system 42 takes the input voltage $V_{in}$ and supplies an output current from the collectors of transistors 92 and 96 to the transimpedance amplifier 44 shown in FIG. 4. Amplifier 44 receives the input current from amplifier 42 at the emitter of an NPN transistor 130 and the emitter of a PNP transistor 132. Transistors 130 and 132 are on the order of 30 times the minimum transistor size.

Amplifier system 44 also receives a reference voltage signal from the bias network 50. The reference voltage signal is connected to the emitter of an NPN transistor 134 and to the emitter of a PNP transistor 136. Transistors 134 and 136 are on the order of 5 times the minimum transistor size. The base of transistor 134 is connected to the collector of transistor 134 and to the base of transistor 130. The base and collector of transistor 134 are connected to the collector of a PNP transistor 138 which is on the order of 5 times the minimum transistor size. The emitter of transistor 138 is connected to the collector of a PNP transistor 140 and to the base of a PNP transistor 142. The base of transistor 140 is connected to the base of transistor 142. Transistors 140 and 142 are both on the order of 5 times the minimum transistor size. The emitters of transistors of 142 are both connected to the 80 volt voltage supply. The collector of transistor 142 is connected to the base of transistor 138. The collector of transistor 142 is also connected to the collector of an NPN transistor 144 through a resistor 146. Resistor 146 is on the order of 70 KΩ in resistance. Transistor 144 is on the order of 5 times the minimum transistor size. The emitter of transistor 144 is coupled to ground potential. The base of transistor 144 is coupled to the base and to the collector of an NPN transistor 148 which is on the order of 5 times the minimum transistor size. The emitter of transistor 148 is coupled to ground potential. The collector of transistor 148 is coupled to the emitter of an NPN transistor 150. Transistor 150 is on the order of 5 times the minimum transistor size. The base of transistor 150 is coupled to the collector of transistor 144. The collector of transistor 150 is coupled to the emitter of an NPN transistor 152 which is on the order of 5 times the minimum transistor size. The base of 152 is coupled to the 12 volt voltage supply. The collector of transistor 152 is coupled to the base and the collector of transistor 136 and to the base of transistor 132.

The collector of transistor of 132 is coupled to the base and collector of an NPN transistor 154 which is on the order of 10 times the minimum transistor size. The emitter of transistor 154 is coupled to ground potential through a resistor 156 which is on the order of 20 Ω in resistance. The base and collector of transistor 154 are connected to the base of an NPN transistor 158 which is on the order of 20 times the minimum transistor size. The emitter of transmitter 158 is coupled to ground potential through the parallel connection of resistors 160 and 162 which are each on the order of 20 Ω in resistance.

The collector of transistor 158 is coupled to the base of an NPN transistor 164 through a resistor 166 which is on the order of 100 Ω in resistance. The collector of transistor 158 is coupled to the emitter of transistor 164. The base of transistor 164 is coupled to the collector of transistor 164 through a resistor 168 which is on the order of 60 Ω in resistance.

The collector of transistor 164 is connected to the collector of a PNP transistor 170 which is on the order of 50 times the minimum transistor size. The emitter of transistor 170 is connected to the 80 volt voltage supply through the parallel connection of resistors 172 and resistor 174 which are each on the order of 20 in resistance. The base of transistor 170 is connected to the 80 volt voltage supply through a resistor 176 which is on the order of 800 Ω in resistance. The base of transistor of 170 is also connected to the collector of transistor 130 through a resistor 178 which is on the order of 3200 Ω in resistance.

The base of transistor 170 is also connected to the base of a PNP transistor 180 which is on the order of 10 times the minimum transistor size. The emitter of transistor 180 is connected to the 80 volt voltage supply through a resistor 182 which is on the order of 20 Ω in resistance.

The collector of transistor 170 and the collector of transistor 174 are connected to the base of an NPN transistor 184. The collector of transistor 184 is connected to the 80 volt voltage supply. The emitter of transistor 184 is connected to the output node which emits the output voltage $V_{OUT}$ through a series connection of resistors 186 and 188. Transistor 184 is on the order of 200 times the size of the minimum transistor. Resistor 186 is on the order of 20 Ω in resistance. Resistor 188 is on the order of 10 Ω in resistance.

The emitter of transistor of 164 and the collector of transistor 158 are coupled to the base of a PNP transistor 190. The collector of transistor 190 is connected to ground potential. The emitter of transistor 190 is connected to the output node through the series connection of resistors 192 and 194. Resistor 192 is on the order of 20 Ω in resistance. Resistor 194 is on the order of 10 Ω in resistance. Transistor 190 is sized on the order of 200 times the minimum transistor size. Finally, feedback resistor 46 is coupled between the output voltage node and the input voltage node connected to the emitter of transistors 130 and 132. Resistor 46 is on the order of 1750 Ω in resistance.

In operation, transistors 144, 148 and 150 operate as a Wilson current mirror. Similarly, transistors 142, 140 and 138 operate as a Wilson current mirror. The reference voltage is received at the node between transistors 134 and 136. This reference voltage causes an adjustment in the current mirrors formed by transistors 134 and 130 and 136 and 132, respectively. As the input signal received at the node between transistors 130 and 132 varies, the variances are translated through the current mirrors formed by transistors 180 and 170 and 154 and 158, respectively. This change, is once again, cascaded through the operation of transistor 164 into the pull-up transistor 184 and the pull-down transistor 190. Transistors 184 and 190 are massive devices which allow the large voltage swings at the output voltage between them.

Through the use of the cascaded current mirrors within the system 44 the large power dissipation at single devices associated with prior architectures is avoided. As such, the entire system shown with references to FIGS. 3 and 4 can be placed on a single semiconductor substrate.

Although the present invention has been described in detail it should be understood that various changes, alterations, substitutions, and modifications may be made to the teachings described herein without departing from the scope of the present invention which is solely defined by the appended claims.

What is claimed is:

1. A monolithic power amplifier circuit, comprising:
   a bias network formed in a semiconductor substrate and operable to receive a first supply voltage and to output a bias voltage signal;
   a transconductance amplifier circuit formed in the semiconductor substrate and operable to receive first and second supply voltages and an input voltage signal and to output an output current;
   a transimpedance amplifier circuit formed in the semiconductor substrate and operable to receive the first and second supply voltages, the bias voltage from the bias network and the output current signal from the transconductance amplifier circuit, the transimpedance amplifier circuit operable to output a output voltage signal sufficient in magnitude to drive a cathode of an electron gun of a video system; and
   the transimpedance amplifier comprising a pull-up transistor coupled between the first supply voltage and the output voltage and a node operable to output the output voltage signal, the transimpedance amplifier circuit further comprising a pull-down transistor coupled between around potential and the output node, the transimpedance amplifier further comprising a plurality of current mirrors operable to communicate modulations in the current signal received from the transconductance amplifier circuit to the pull-up and pull-down transistors coupled to the output node;
   the transimpedance amplifier circuit further including:
      a first Wilson current mirror coupled between the first supply voltage and a node within the transimpedance amplifier circuit at which the bias voltage signal is received from the bias network; and a second Wilson current mirror coupled between the node at which the bias voltage signal is received from the bias network and ground potential;

a first transfer current mirror coupled to the node at which the bias voltage signal is received, the node at which the current signal is received from the transconductor amplifier and the first Wilson current mirror; and a second transfer current mirror coupled to the node at which the bias voltage signal is received, the node at which the current signal is received from the transconductor amplifier circuit and the second Wilson current mirror.

2. The power amplifier circuit of claim 1 and further comprising:

a third transfer current mirror coupled between the first transfer current mirror and a transfer transistor;

a fourth transfer current mirror coupled between the second transfer current mirror and the transfer transistor; and the pull-up transistor Is coupled between the third transfer current mirror and the transfer transistor, and the pull-down transistor is coupled between the fourth transfer current mirror and the transfer transistor.

3. The monolithic power amplifier circuit of claim 1 and further comprising a feedback resistor coupled between a node of the transimpedance amplifier operable to receive the output current signal from the transconductance amplifier circuit and a node of the transimpedance amplifier operable to output the output voltage signal.

4. The monolithic power amplifier circuit of claim 1 wherein the pull-up transistor comprises an NPN type bipolar transistor and wherein the pull-down transistor comprises a PNP type bipolar transistor.

5. A method of forming a monolithic power amplifier circuit comprising the steps of:

forming a bias network in a semiconductor substrate operable to receive a first supply voltage and to output a bias voltage signal;

forming a transconductance amplifier circuit in the semiconductor substrate operable to receive first and second supply voltages and an input voltage signal and to output an output current;

forming a transimpedance amplifier circuit in the semiconductor substrate operable to receive the first and second supply voltages, the bias voltage from the bias network and the output current signal from the transconductance amplifier circuit, the transimpedance amplifier circuit operable to output a output voltage signal sufficient in magnitude to drive a cathode of an electron gun of a video system, the transimpedance amplifier formed to comprise a pull-up transistor coupled between the first supply voltage and the output voltage and a node operable to output the output voltage signal, the transimpedance amplifier circuit further formed to comprise a pull-down transistor coupled between ground potential and the output node, the transimpedance amplifier further formed to comprise a plurality of current mirrors operable to communicate modulations in the current signal received from the transconductance amplifier circuit to the pull-up and pull-down transistors coupled to the output node, the transimpedance amplifier circuit further including:

a first Wilson current mirror coupled between the first supply voltage and a node within the transimpedance amplifier circuit at which the bias voltage signal is received from the bias network; and a second Wilson current mirror coupled between the node at which the bias voltage signal is received from the bias network and around potential;

a first transfer current mirror coupled to the node at which the bias voltage signal is received, the node at which the current signal is received from the transconductor amplifier and the first Wilson current mirror; and a second transfer current mirror coupled to the node at which the bias voltage signal is received, the node at which the current signal is received from the transconductor amplifier circuit and the second Wilson current mirror.

6. A monolithic power amplifier circuit, comprising:

a bias network formed in a semiconductor substrate and operable to receive a first supply voltage and to output a bias voltage signal;

a transconductance amplifier circuit formed in the semiconductor substrate and operable to receive first and second supply voltages and an input voltage signal and to output an output current;

a transimpedance amplifier circuit formed in the semiconductor substrate and operable to receive the first and second supply voltages, the bias voltage from the bias network and the output current signal from the transconductance amplifier circuit, the transimpedance amplifier circuit operable to output a output voltage signal sufficient in magnitude to drive a cathode of an electron gun of a video system;

the transimpedance amplifier comprising a pull-up transistor coupled between the first supply voltage and the output voltage and a node operable to output the output voltage signal, the transimpedance amplifier circuit further comprising a pull-down transistor coupled between ground potential and the output node;

a first Wilson current mirror coupled between the first supply voltage and a node at which the bias voltage signal is received from the bias network; and a second Wilson current mirror coupled between the node at which the bias voltage signal is received from the bias network and ground potential;

a first transfer current mirror coupled to the node at which the bias voltage signal is received, the node at which the current signal is received from the transconductor amplifier and the first Wilson current mirror; and a second transfer current mirror coupled to the node at which the bias voltage signal is received, the node at which the current signal is received from the transconductor amplifier circuit and the second Wilson current mirror.

7. The monolithic power amplifier circuit of claim 6 and further comprising a feedback resistor coupled between the node of the transimpedance amplifier operable to receive the output current signal from the transconductance amplifier circuit and the node of the transimpedance amplifier operable to output the output voltage signal.

8. The monolithic power amplifier circuit of claim 6 wherein the pull-up transistor comprises a NPN type bipolar transistor and wherein the pull-down transistor comprises a PNP type bipolar transistor.

9. A method of forming a monolithic power amplifier circuit as defined in claim 5, the transimpedance amplifier circuit further including:

a third transfer current mirror coupled between the first transfer current mirror and a transfer transistor;

a fourth transfer current mirror coupled between the second transfer current mirror and the transfer transistor; and the pull-up transistor is coupled between the third transfer current mirror and the transfer transistor, and the pull-down transistor is coupled between the fourth transfer current mirror and the transfer transistor.

\* \* \* \* \*